United States Patent
Sakurai et al.

(10) Patent No.: US 7,375,421 B2
(45) Date of Patent: May 20, 2008

(54) HIGH DENSITY MULTILAYER CIRCUIT MODULE

(75) Inventors: Daisuke Sakurai, Toyonaka (JP); Kazuhiro Nishikawa, Osaka (JP); Norihito Tsukahara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/147,864

(22) Filed: Jun. 8, 2005

(65) Prior Publication Data

US 2005/0275088 A1    Dec. 15, 2005

(30) Foreign Application Priority Data

Jun. 15, 2004    (JP) .............................. 2004-176838

(51) Int. Cl.
*H01R 4/58* (2006.01)
*H01L 23/48* (2006.01)

(52) U.S. Cl. .............. 257/686; 257/E23.013; 257/E23.019; 257/E23.064; 257/E23.17; 257/E23.07; 257/E23.174; 257/E23.178; 257/E25.011; 257/E23.063; 257/685; 257/723; 257/777; 257/778; 257/737; 257/696; 257/698; 257/724; 257/730; 361/749; 361/760; 439/91

(58) Field of Classification Search ............... 257/686, 257/685, 723, 777, 778, 737, 734, 738, 696, 257/698, 700, 701, 724, 688, E23.013, E23.19, 257/E23.064, E23.07, E23.17, E23.174, E21.705, 257/E23.178, E25.011, E23.063, 730; 361/749, 361/760; 439/91

See application file for complete search history.

(56) References Cited

U.S. PATENT DOCUMENTS

| | | | |
|---|---|---|---|
| 6,225,688 B1 | 5/2001 | Kim et al. | |
| 6,376,769 B1 * | 4/2002 | Chung | 174/524 |
| 6,489,685 B2 * | 12/2002 | Asahi et al. | 257/774 |
| 6,538,210 B2 * | 3/2003 | Sugaya et al. | 174/258 |
| 6,862,191 B1 * | 3/2005 | Youker et al. | 361/768 |
| 6,890,186 B2 * | 5/2005 | Chien | 439/68 |
| 6,940,158 B2 * | 9/2005 | Haba et al. | 257/686 |
| 7,071,547 B2 * | 7/2006 | Kang et al. | 257/686 |
| 7,091,593 B2 * | 8/2006 | Ishimaru et al. | 257/686 |
| 7,122,901 B2 * | 10/2006 | Sunohara et al. | 257/758 |
| 2005/0158911 A1 * | 7/2005 | Uwada et al. | 438/108 |
| 2005/0233496 A1 * | 10/2005 | Haba et al. | 438/109 |

FOREIGN PATENT DOCUMENTS

| | | | |
|---|---|---|---|
| JP | 02-239695 A | | 9/1990 |
| JP | 11-54939 | * | 2/1999 |
| JP | 2001-093934 | | 4/2001 |
| JP | 2002-43513 A | | 2/2002 |
| JP | 2004-363568 | * | 12/2004 |

* cited by examiner

*Primary Examiner*—Alexander O Williams
(74) *Attorney, Agent, or Firm*—RatnerPrestia

(57) ABSTRACT

Thinning and stacking are essential for circuit modules used for mobile devices of various kinds, smart cards, memory cards and the like. These demands make the manufacture of the circuit modules more complicated or less reliable due to delamination. A circuit module of a multilayer structure is provided which is formed by embedding semiconductor chips and passive components in a sheet made from a thermoplastic resin; folding a module sheet, which is formed of circuit blocks provided with wiring patterns thereon, at the boundaries of the circuit blocks so as to be stacked into layers; and thermal-bonding and integrating the module sheet by applying heat and pressure. As a result, a highly reliable circuit module can be manufactured in a simple manner.

7 Claims, 10 Drawing Sheets

HIGH DENSITY MULTILAYER CIRCUIT MODULE

BACKGROUND OF THE INVENTION

1. Field of the Invention

The present invention relates to a circuit module in which a sheet embedded with electronic components and provided with wiring patterns is folded into layers connected with each other, and also relates to a method for manufacturing such a circuit module.

2. Background Art

Mobile devices have been increasing in functionality while reducing in size and weight. With this tendency, circuit modules having a circuit board and electronic components mounted on the circuit board have been expected to be higher in performance and density. As smart cards and memory cards spread, there is a growing need for flexible circuit modules that are thin, high-performing, highly-reliable and inexpensive.

Japanese Patent Unexamined Publication No. 2002-43513 discloses a semiconductor device having a multilayer structure shown in FIG. 11 and a method for manufacturing the semiconductor device. According to this manufacturing method, as shown in FIG. 11, a plurality of semiconductor chips 1010 and components 1020 are mounted on support 1030 provided with wiring patterns. Later, insulating resin 1040 is applied to mold. Support 1030 provided with these components is folded in units of regions to form three stacked layers, and is then molded with insulating resin 1050. This is how the semiconductor device with the multilayer structure is obtained.

In the case of this device, in order to maintain the positional relation between semiconductor chips 1010 and components 1020 until the final condition, support 1030 is required to have appropriate stiffness. This sets a limit to reducing the thickness of modules having such a structure.

Japanese Patent Unexamined Publication No. H02-239695 discloses a multilayer printed wiring board, which also has a multilayer structure. According to the disclosure, first of all, a two-sided flexible substrate is prepared by forming a flexible sheet provided with necessary wiring patters and electrode pads. Then, this flexible substrate is folded at appropriate positions into stacked layers. The exposed regions of the conductors stacked with each other are bonded by applying solder or conductive adhesive so as to form a multilayer structure. This results in the multilayer printed wiring board. In this method, however, the printed wiring board is not embedded with electronic components, thereby making it difficult to manufacture a high-performing electronic circuit.

U.S. Pat. No. 6,225,688 discloses a mounting structure in which a film substrate is mounted with electronic components with their faces down, and is folded into layers.

Japanese Patent Unexamined Publication No. 2001-93934 discloses a method for mounting a semiconductor element. In this method, bumps are formed on a semiconductor element by wire bonding. The semiconductor element is embedded in a thermoplastic resin, with the bumps exposed. Then, wiring patterns are formed on the surface of the thermoplastic resin having the exposed bumps. Later, more thermoplastic resin is applied to mold. Thus, this patent document discloses a method for mounting a semiconductor element, but not a multilayer structure.

For mobile devices of various kinds, smart cards, memory cards and the like, circuit modules in which a flexible sheet is mounted with semiconductor chips and components and also provided on both sides thereof with wiring patterns are widely used. For the purpose of increasing the mounting density, circuit modules in which a substrate mounted with semiconductor chips and components is folded into a lager number of layers have been being developed.

However, in smart cards, memory cards and the like, it is required not only to improve the mounting density and reliability, but also to achieve high functionality in a shape that is standardized as the product shape.

In recent years, circuit scale (such as memory capacity) has been growing with the development of mobile devices, smart cards and memory cards. In order to meet this demand, in the aforementioned conventional examples, a flexible sheet mounted with electronic components is folded to form a multilayer substrate or a circuit module with layers stacked via an adhesive layer. Such a multilayer structure can increase the circuit scale and the like. However, the difference in material between the adhesive and the flexible sheet makes them have different thermal expansion coefficients from each other. The difference in the thermal expansion coefficients produces a stress which is likely to cause delamination. Preventing a decrease in reliability requires a substrate having a certain thickness; however, in smart cards and the like which are expected to have a limited thickness, it is difficult to expand the circuit scale by folding the substrate into stacked layers.

To solve the aforementioned problems, the present invention has an object of providing a circuit module in which a flexible sheet embedded with semiconductor chips and components is folded at predetermined positions into layers that are thermal-bonded and integrated with each other by applying a heat and pressure treatment, and also providing a method for manufacturing such a circuit module.

SUMMARY OF THE INVENTION

The circuit module of the present invention, in which a component-embedded sheet is embedded with electronic components and is folded into stacked layers, comprises: the component-embedded sheet having circuit blocks which are embedded with the electronic components, with at least the surfaces of projecting electrodes of the electronic components exposed; a wiring pattern which is connected with the projecting electrodes of the component-embedded sheet; and a cover sheet coating the wiring pattern, wherein the circuit blocks are folded along the boundaries between the circuit blocks and are stacked with one another, and the component-embedded sheet and the cover sheet are thermal-bonded and integrated with each other.

A method for manufacturing a circuit module according to the present invention comprises: forming a component-embedded sheet having circuit blocks which are embedded with electronic components, with at least surfaces of projecting electrodes of the electronic components exposed; forming a wiring pattern which is connected with the projecting electrodes of the component-embedded sheet; coating the wiring pattern with a cover sheet; folding the component-embedded sheet along the boundaries between the circuit blocks, thereby being stacked into layers; and thermal-bonding and integrating the component-embedded sheet and the cover sheet, which have been stacked into layers, by hot pressing.

Another method for manufacturing a circuit module according to the present invention comprises: forming a component-embedded sheet having circuit blocks which are embedded with electronic components, with at least surfaces of projecting electrodes of the electronic components exposed; forming a wiring pattern connected with the projecting electrodes of the component-embedded sheet; laminating the component-embedded sheet embedded with the electronic components with a cover sheet; folding the component-embedded sheet along the boundaries between the circuit blocks, thereby being stacked into layers; and thermal-bonding and integrating the component-embedded sheet and the cover sheet, which have been stacked into layers, by hot pressing.

DETAILED DESCRIPTION OF THE INVENTION

Embodiments of the present invention will be described as follows with reference to accompanying drawings.

FIRST EMBODIMENT

Figure 1:
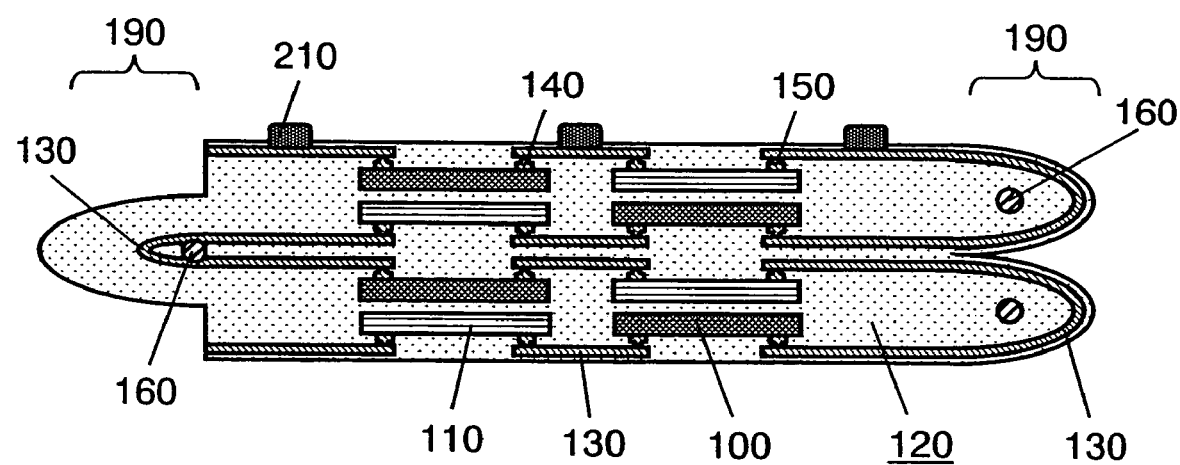
FIG. 1 is a cross sectional view of a circuit module according to a first embodiment of the present invention.

FIG. 1 is a cross sectional view of a circuit module according to a first embodiment of the present invention.

The circuit module shown in FIG. 1 has a four-layer structure, in which the four layers of component-embedded sheet 120 are embedded with electronic components such as semiconductor chips 100 and passive components 110, and are provided with wiring patterns 130. Each of semiconductor chips 100 has electrodes (not illustrated), which are provided with bumps 140. Each of passive components 110 is provided with projecting electrodes 150. Note that in the following description, the projecting electrodes formed on semiconductor chips 100 are referred to as bumps 140 as distinguished from projecting electrodes 150 of passive components 110, but their functions are identical.

Wiring patterns 130 are also formed in folded parts 190 of component-embedded sheet 120 so that bumps 140 of semiconductor chips 100 or projecting electrodes 150 of passive components 110 formed on each layer can be electrically connected with each other. The four layers of component-embedded sheet 120, which may be laminated with a cover sheet as necessary, are integrated with each other by thermal bonding in such a manner that their boundaries are thermal-bonded and lost, and that semiconductor chips 100 and passive components 110 are completely embedded. Note that in the following description, for the sake of clarity, a cover sheet formed on the wiring patterns 130 side is referred to as a first cover sheet, whereas a cover sheet formed on the other surfaces is referred to as a second cover sheet.

In FIG. 1, folded parts 190 still have small-diameter support bars 160 inside, which may be removed after the integration of the layers. Support bars 160 are used to prevent wiring patterns 130 from being disconnected in the folding process, and their absence does not cause any problem in the operation of the circuit module.

Figure 2:
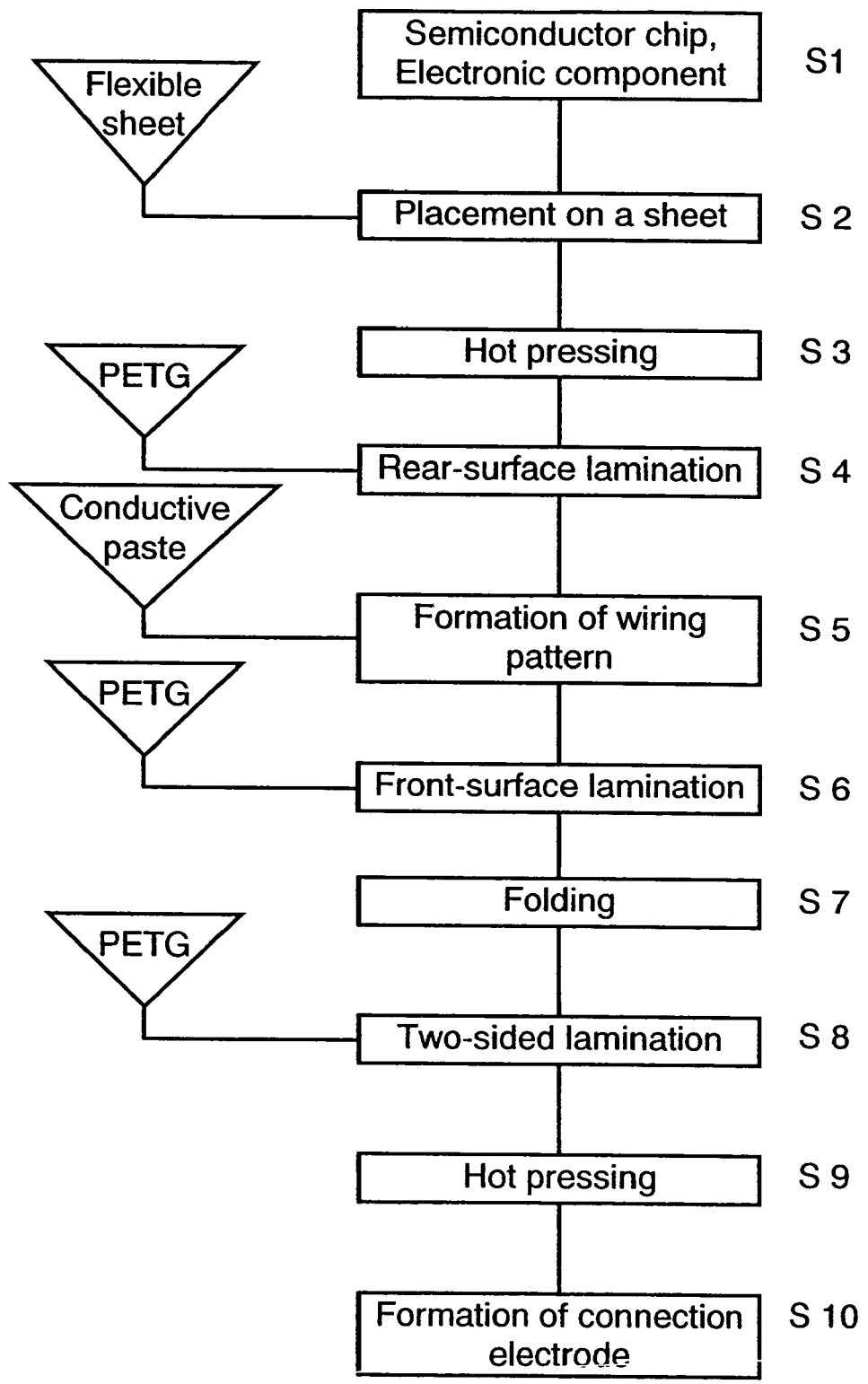
FIG. 2 is a flowchart depicting a method for manufacturing the circuit module according to the first embodiment of the present invention.
Figure 3A:
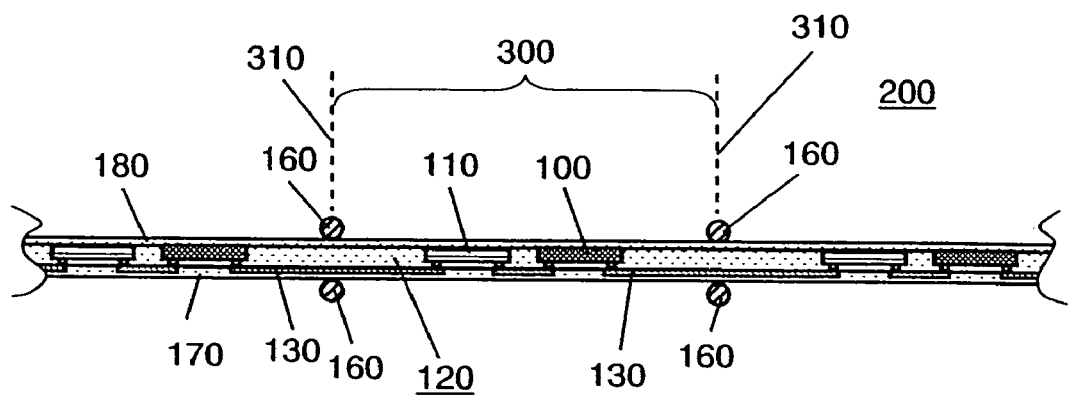
FIGS. 3A-3C are cross sectional views of main parts of the circuit module during and after main processes of the processes shown in FIG. 2.
Figure 3B:
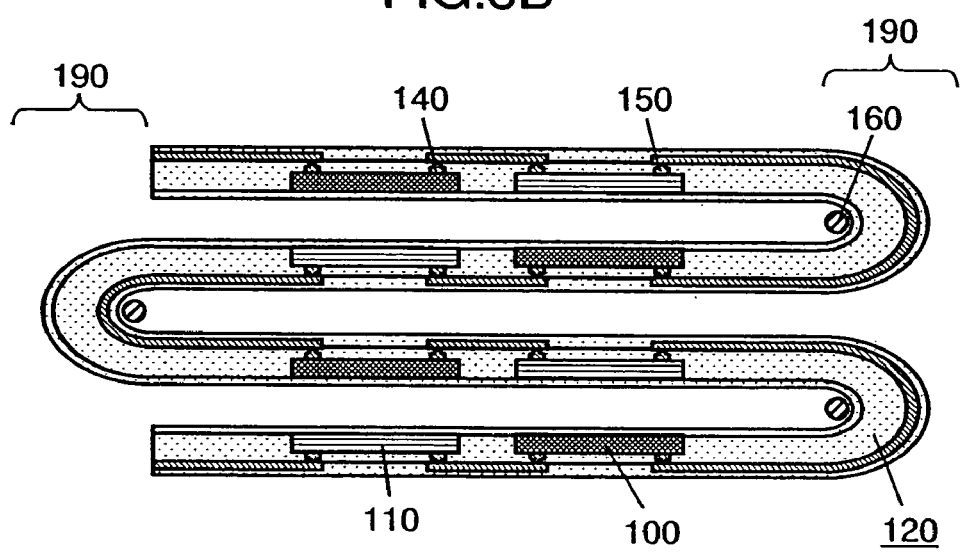
Figure 3C:
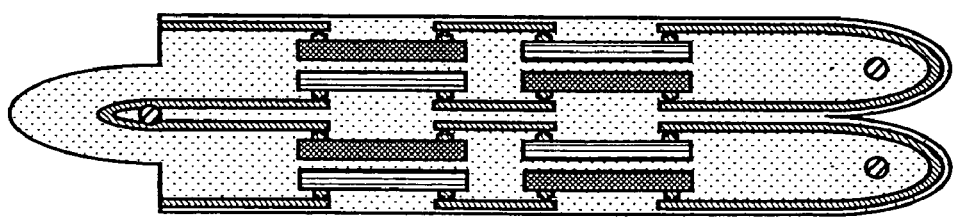

FIG. 2 is a flowchart depicting the manufacturing processes of the circuit module according to the present embodiment. FIGS. 3A to 3C are cross sectional views of main parts of the circuit module during and after main processes of the processes shown in FIG. 2.

The method for manufacturing the circuit module according to the present embodiment will be described as follows with reference to FIG. 2 and FIGS. 3A-3C.

First, at Step S1, semiconductor chips 100 and passive components 110 are prepared. Semiconductor chips 100 are polished into a flaky shape, and have bumps 140 formed on their electrodes (not illustrated) by wire bonding or the like. Passive components 110 are provided with projecting electrodes 150. Semiconductor chips 100 and passive components 110 may have a thickness of 50 μm. Bumps 140 and projecting electrodes 150 have preferably a uniform height of about 25 μm by polishing or pressing, but the height is not limited to this size. Bumps 140 may be formed by applying plating, conductive paste, solder or the like.

At Step S2, one or more of semiconductor chips 100 provided with bumps 140 and one or more of passive components 110 provided with projecting electrodes 150 are placed in predetermined positions on predetermined ones of circuit blocks 300 of a sheet which is about 75 μm in thickness and made from a thermoplastic resin. The thermoplastic resin can be polyethylene terephthalate (PETG), vinyl chloride, polycarbonate, acrylonitrile butadiene styrene or the like. The sheet can be made from a thermosetting resin such as epoxy resin, or a mixture of a thermoplastic resin such as thermoplastic polyimide and a thermosetting resin.

At Step S3, the sheet mounted with semiconductor chips 100 and passive components 110 is sandwiched between hot press plates and pressed while applying heat. In the case where the sheet is made from PETG, the pressing conditions are as follows: a pressure of 30 kg/cm$^2$, a temperature of 150° C. and a pressing time of 2 minutes. This process puts the sheet in a temporarily molten state, in which semiconductor chips 100 and passive components 110 are embedded in the sheet, with at least the surfaces of bumps 140 and projecting electrodes 150 exposed on a surface of the sheet. This embedding results in the formation of component-embedded sheet 120. After the embedding, the sheet surface may be cleaned with plasma or the like for the purpose of securing the exposure of bumps 140 and projecting electrodes 150.

At Step S4, second cover sheet 180 is laminated on the rear surface of component-embedded sheet 120 that is embedded with semiconductor chips 100 and passive components 110. This process can be omitted if the rear surface of the component-embedded sheet 120 that is embedded with semiconductor chips 100 and passive components 110 has a high bonding strength when thermal-bonded. This omission results in a thinner circuit module. Alternatively, second cover sheet 180 may be laminated at Step S6 described later.

At Step S5, conductive paste is screen-printed onto the front surface of component-embedded sheet 120 (e.g., in the case of being made from material whose softening temperature is 120° C.) on which the surfaces of bumps 140 and projecting electrodes 150 are exposed. The conductive paste is dried and hardened by being heated, e.g. at 110° C. for 10 minutes so as to form wiring patterns 130 of, e.g. 15 µm in thickness which have a predetermined pattern shape. Wiring patterns 130 may be formed by screen-printing conductive paste such as nano paste, plating, sputtering or the like. In order to improve the reliability of folded parts 190, it is preferable to make wiring patterns 130 from a metallic material that is excellent in malleability and ductility and with high bending resistance, namely, gold, silver or copper.

At Step S6, the front surface of component-embedded sheet 120 provided with wiring patterns 130 is laminated with first cover sheet 170 which is made from PETG or the like and is 25 µm in thickness. At this moment, second cover sheet 180 described at Step S4 may be laminated together.

FIG. 3A is a cross sectional view of the structure of the circuit module when the processes at Steps S1 to S6 are complete. When made from the same material, component-embedded sheet 120, first cover sheet 170 and second cover sheet 180 can be easily integrated by thermal bonding. Preferably, the softening temperature of these cover sheets is as low as, or lower than the softening temperature of the sheet composing component-embedded sheet 120 so as to avoid the flux of semiconductor chips 100 and passive components 110.

In the following description, an integrated structure with three stacked layers: component-embedded sheet 120, first cover sheet 170 and second cover sheet 180 is simply referred to as module sheet 200.

At Step S7, circuit block 300 of module sheet 200 which is to be the lowermost layer of module sheet 200, is fixed on a flat base, and support bars 160 are placed in boundary regions 310 of circuit block 300 along which module sheet 200 is folded. Then, as shown in FIG. 3B, module sheet 200 is folded around support bars 160 in an S-shaped configuration. Thus, a four-layer circuit module is prepared.

The way of folding the sheet is not necessarily in the form of the letter S, but can be, e.g. like a scroll by folding module sheet 200 at any positions of circuit blocks 300. Support bars 160 may be made of the same material as component-embedded sheet 120, that is, plastics such as ABS resin or acrylic resin, or metallic materials such as stainless steel. In the case where support bars 160 are removed after module sheet 200 is folded and integrated, the surfaces of support bars 160 are preferably subjected to a demolding process by being coated with fluororesin or the like.

It is also possible to make support bars 160 from metal wire having a high electric resistance such as nichrome, as long as electrical isolation is provided between support bars 160 and wiring patterns 130. Then, support bars 160 can be supplied with an electric current to soften component-embedded sheet 120, first cover sheet 170 and second cover sheet 180, thereby folding module sheet 200, with support bars 160 bonded thereto.

In this case, module sheet 200 is fixed at the positions of support bars 160, and folded parts 190 are softened. This can improve the bending precision in the folding positions.

In the case where the positioning between the layers must be precise, it is possible to use optical positioning with positioning marks previously provided on each layer. Alternatively, it is possible to perform positioning by forming some positioning holes.

At Step S8, module sheet 200 that has been folded is laminated with a protective sheet or the like in the case where high reliability including moisture resistance is required. However, Step S8 is not essential.

At Step S9, module sheet 200, which has been folded into four layers or laminated after that with the protective sheet, is sandwiched between hot press plates and pressed while applying heat. In the case where module sheet 200 is made from PETG, the pressing conditions are as follows: a pressure of 35 kg/cm$^2$, a temperature of 110° C. and a pressing time of 1 minute.

By this process, the layers of module sheet 200 are thermal-bonded and integrated with each other. As a result, the structure shown in FIG. 3C is obtained in which all of semiconductor chips 100 and passive components 110 are completely embedded in module sheet 200.

Finally, at Step S10, the outermost layer regions of module sheet 200 in which to form the electrodes to be connected with an external circuit are removed with a laser or the like so as to partly expose wiring patterns 130. Then, connection electrodes 210 are formed on the exposed regions of the surface of module sheet 200 by applying conductive paste or solder balls.

Through these processes, the circuit module shown in FIG. 1 is complete.

The following is a description about a circuit module of a modified example of the circuit module according to the present embodiment.

The circuit module of this modified example is characterized in that when wiring patterns 130 are formed at Step S5 shown in FIG. 2 by screen-printing the conductive paste on the front surface of component-embedded sheet 120 that has bumps 140 exposed thereon, passive components 110 to be electrically connected with wiring patterns 130 are formed at the same time. Passive components 110 can be thin-film inductors or thick-film inductors, or passive elements such as capacitors or resistors. Passive components 110 made of such passive elements can be formed using a paste for thick-film electronic components or a dielectric material by screen-printing, or drawing with ink jet technology or dispenser technology. Alternatively, it is also possible to mount passive components 110 such as sheet-like devices onto the surface of component-embedded sheet 120 via conductive paste or the like.

Consequently, of the plurality of layers of component-embedded sheet 120, a certain layer can be used as the region to form the thick-film electronic components and be embedded with inductors, capacitors resistors and the like, which make up a large area of the sheet, so as to obtain a high-density circuit module. It is also possible to form thin- or thick-film electronic components in folded parts 190, too.

Later, by going through the same processes as those shown in FIG. 2, a circuit module embedded with thin- or thick-film electronic components can be obtained.

Figure 4:
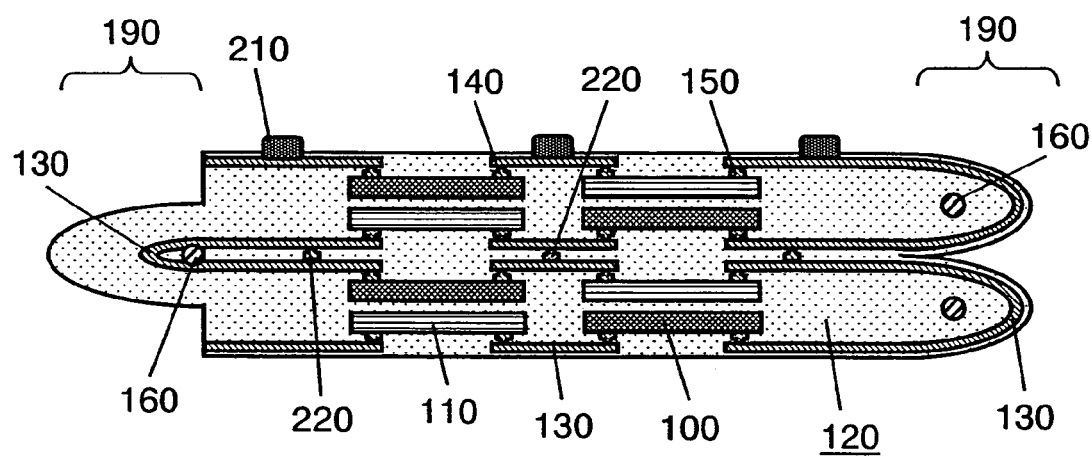
FIG. 4 is a cross sectional view of a circuit module of a modified example of the circuit module according to the first embodiment of the present invention.

A circuit module of another modified example of the circuit module according to the present embodiment is shown in FIG. 4.

The circuit module of this modified example has a feature as follows. Module sheet 200 formed of four circuit blocks 300 integrally stacked is provided with connection units 220 to electrically connect between specified land regions by using a conductive paste between the second layer and the third layer where wiring patterns 130 are opposed to each other.

This structure can be obtained by removing first cover sheet 170 in the land regions to be connected with each other via connection units 220, and by folding module sheet 200, with land regions filled with the conductive paste, into integrated layers. Connection units 220 make the wiring distance between semiconductor chips 100 and between passive components 110 shorter than in wiring patterns 130 which are connected with each other via folded parts 190.

In the present embodiment, semiconductor chips 100 and passive components 110 are embedded in component-embedded sheet 120. This makes the substantial thickness of the circuit module to be determined by the sum of the total thickness of component-embedded sheet 120, first cover sheet 170 and second cover sheet 180, and the total number of layers to be stacked. As a result, the circuit module can have a very thin multilayer structure.

In the manufacturing method according to the present embodiment, semiconductor chips 100 and passive components 110 which are necessary to form multiple layers of circuit blocks 300 are embedded, in a developed form, on the same surface of component-embedded sheet 120; then, wiring patterns 130 are formed; and component-embedded sheet 120 is folded into stacked layers. This method can simplify the stacking process, as compared with separately forming circuit blocks 300 for the respective layers and then stacking them.

Since being folded and integrated by thermal bonding, module sheet 200 has the advantage of being unlikely to cause delamination, which may lead to electronic migration or breaking of wire and so on.

Note that passive components 110 in the above description can be chip components such as chip capacitors, chip resistors, chip inductors, or chip transistors. Wiring patterns 130, which are formed by printing a conductive paste in the above description, can be formed of a plating layer. Connection electrodes 210 to be connected with an external circuit may be formed of a plating layer, an anisotropic conductive film or the like.

Figure 5:
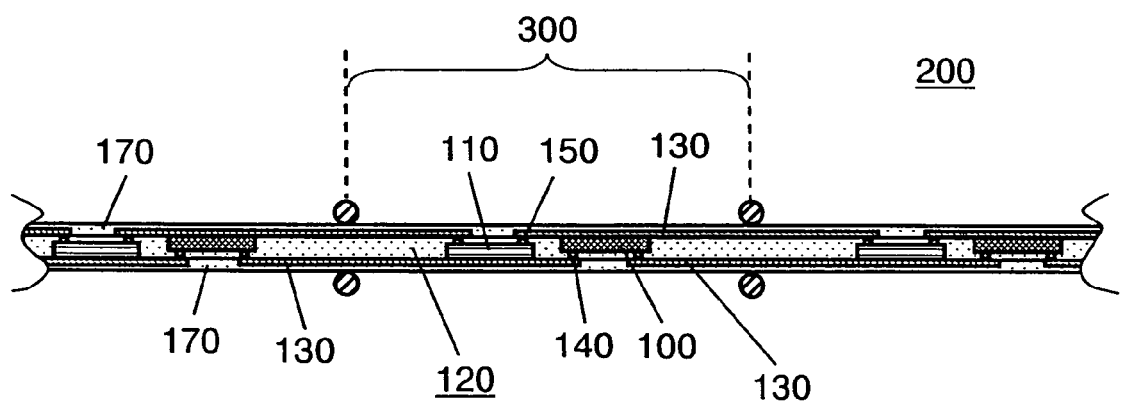
FIG. 5 is a cross sectional view of a circuit module of another modified example of the circuit module according to the first embodiment of the present invention.

The present embodiment shows the case where bumps 140 of semiconductor chips 100 and projecting electrodes 150 of passive components 110 are exposed on one surface of component-embedded sheet 120. However, bumps 140 of semiconductor chips 100 and projecting electrodes 150 of passive components 110 do not have to be exposed on one surface of module sheet 200, but can be exposed on both surfaces thereof as shown in the cross sectional view of FIG. 5, in which the module sheet has not been folded yet. In this case, wiring patterns 130 are provided to connect bumps 140 and projecting electrodes 150 exposed on the same surface. The cover sheet corresponding to first cover sheet 170 may be formed and then folded integrally with component-embedded sheet 120. In the case where component-embedded sheet 120 has so high a bonding strength when it is thermal-bonded as not to cause a shortcircuit between wiring patterns 130 during the integration, there is no need for the cover sheet.

It goes without saying that the aforementioned structure can be used in each of the following embodiments.

SECOND EMBODIMENT

Figure 6:
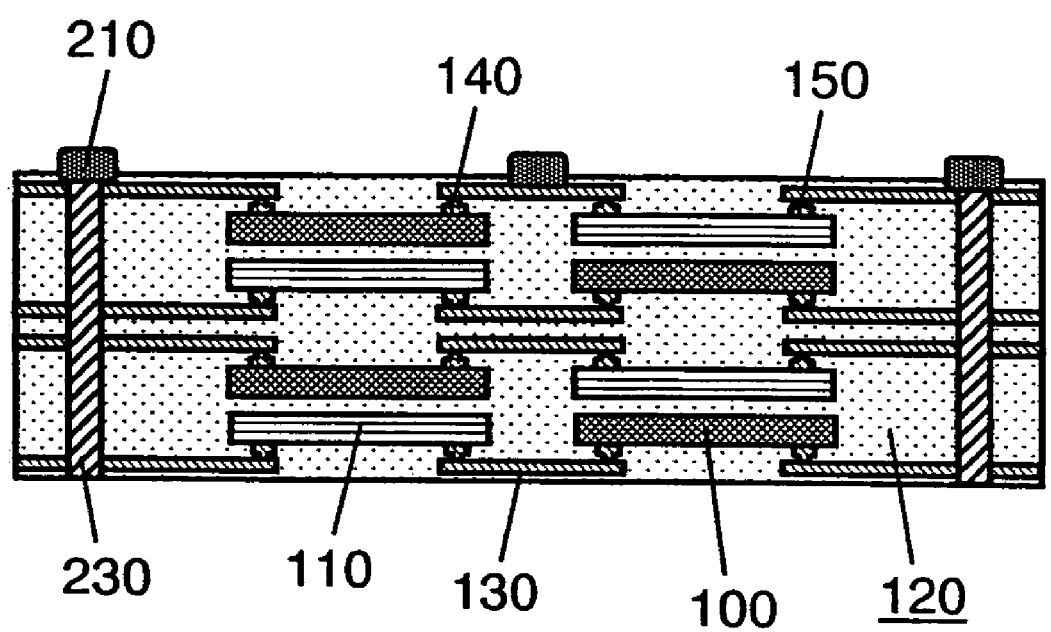
FIG. 6 is a cross sectional view of a circuit module according to a second embodiment of the present invention.

FIG. 6 is a cross sectional view showing a circuit module according to a second embodiment of the present invention.

The circuit module of the present embodiment includes four-layer component-embedded sheet 120 which is embedded with semiconductor chips 100 and passive components 110 and is provided with wiring patterns 130. In the circuit module, folded parts 190 are cut off, and throughholes 230 are formed to electrically connect the different layers.

The same components as those shown in FIG. 1 are referred to with the same reference marks and their description will be omitted. Bumps 140 of semiconductor chips 100 and projecting electrodes 150 of passive components 110 are identical to those employed in the first embodiment. Component-embedded sheet 120 consists of four layers that are thermal-bonded and integrated with each other in such a manner as to have no connection boundaries therebetween any more as in the first embodiment.

The following is a description of a method for manufacturing the circuit module according to the present embodiment.

First, component-embedded sheet 120 embedded with semiconductor chips 100 and passive components 110 is folded into stacked layers and is integrated (corresponding to Step S9 shown in FIG. 2) by applying a heat and pressure treatment in the same manner as in the first embodiment.

Figure 7A:
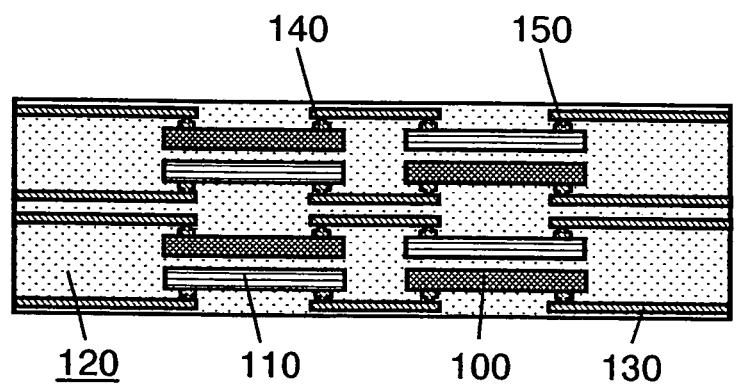
FIGS. 7A-7C are cross sectional views of main parts of the circuit module during and after main processes of the processes involved in the method for manufacturing the circuit module according to the second embodiment of the present invention.

Then, folded parts 190 are cut with a dicing saw, a laser or the like to form a laminate as shown in FIG. 7A.

Figure 7B:
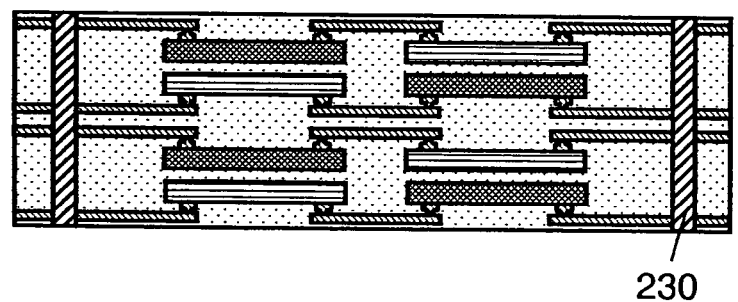

Next, penetrating holes are formed by laser processing or drilling either in the peripheral regions of the laminate where semiconductor chips 100 and passive components 110 are not provided, or between semiconductor chips 100 and between passive components 110. These penetrating holes are filled with conductive paste by screen printing, or are provided with a conductive layer by metal plating, so as to obtain throughholes 230. FIG. 7B shows the structure of the laminate after the completion of this process.

Then, connection electrodes 210 are formed using solder, conductive paste or the like in the positions of throughholes 230 having conductivity to be connected with an external circuit.

Figure 7C:
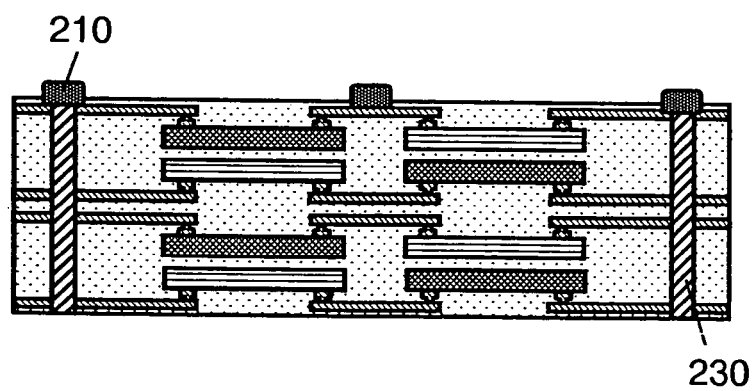

By going through the aforementioned processes, the circuit module as shown in FIGS. 6 and 7C can be obtained.

In the second embodiment of the present invention, the interlayer connection is done via throughholes 230, thereby making the connection wiring shorter than in the first embodiment where the interlayer connection is done via wiring patterns 130 formed on folded parts 190. In particular, the connection wiring between nonadjacent layers can be shortened.

This structure can reduce an increase in the impedance due to the length of the connection wiring of wiring patterns 130, thereby lowering noise and improving high frequency characteristics of the circuit module.

THIRD EMBODIMENT

Figure 8:
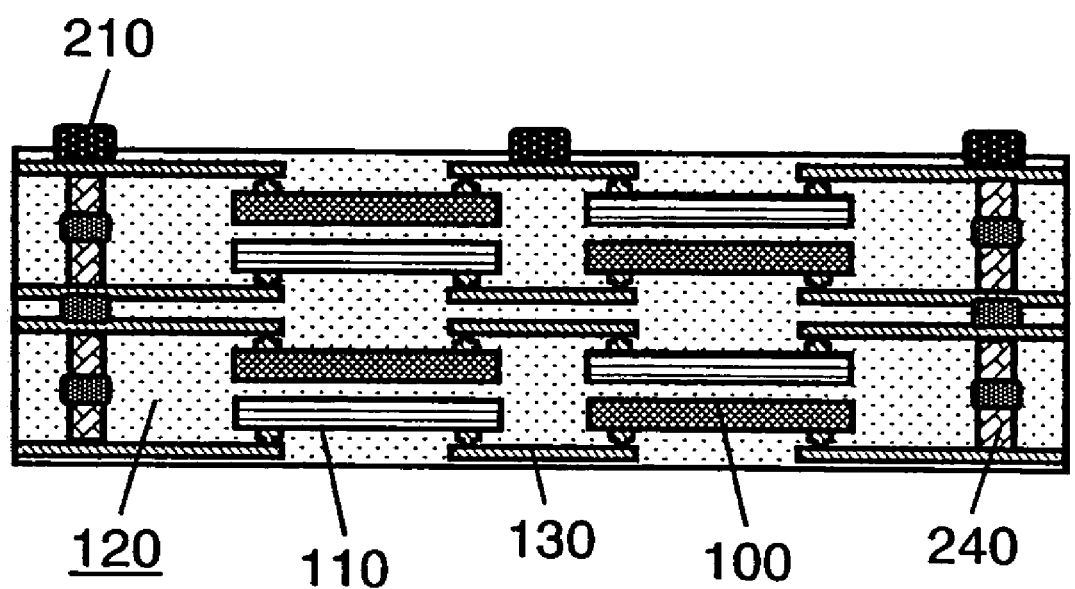
FIG. 8 is a cross sectional view of a circuit module according to a third embodiment of the present invention.

FIG. 8 is a cross sectional view showing the outline structure of a circuit module according to a third embodiment of the present invention.

The circuit module of the present embodiment includes four-layer component-embedded sheet 120 which is embedded with semiconductor chips 100 and passive components 110 and is provided with wiring patterns 130. The circuit module also includes conductive members 240 made of metal wire or the like which are formed to electrically connect the different layers.

The same components as those shown in FIG. 1 are referred to with the same reference marks and their description will be omitted. Bumps 140 of semiconductor chips 100 and projecting electrodes 150 of passive components 110 are identical to those employed in the first embodiment. Module sheet 200 consists of four layers that are thermal-bonded and integrated with each other in such a manner as to have no connection boundaries therebetween any more as in the first embodiment.

In the third embodiment of the present invention, the interlayer connection can be done by providing blind holes instead of throughholes 230.

The following is a description about a method for manufacturing a circuit module according to the present embodiment.

Figure 9:
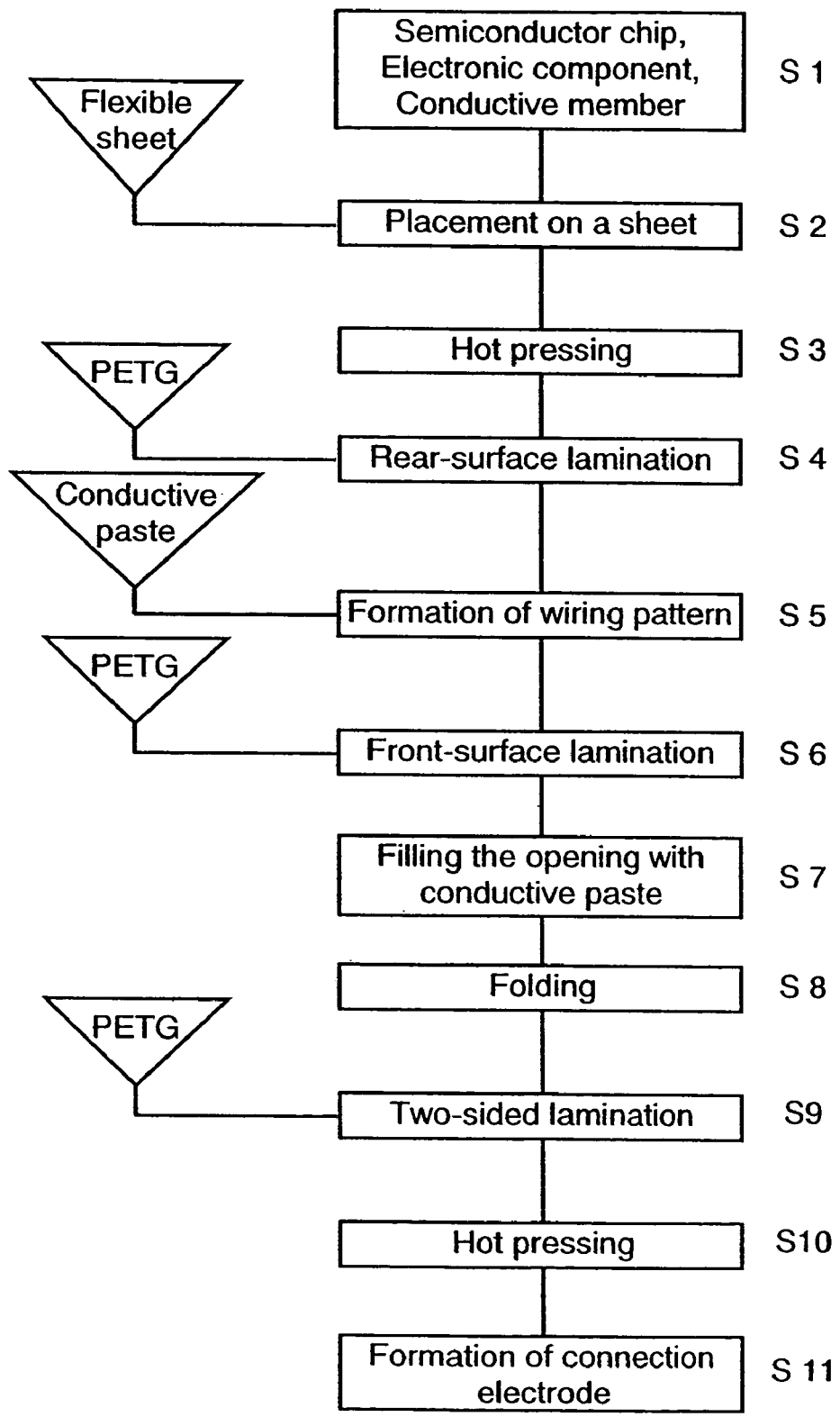
FIG. 9 is a flowchart depicting a method for manufacturing the circuit module according to the third embodiment of the present invention.
Figure 10A:
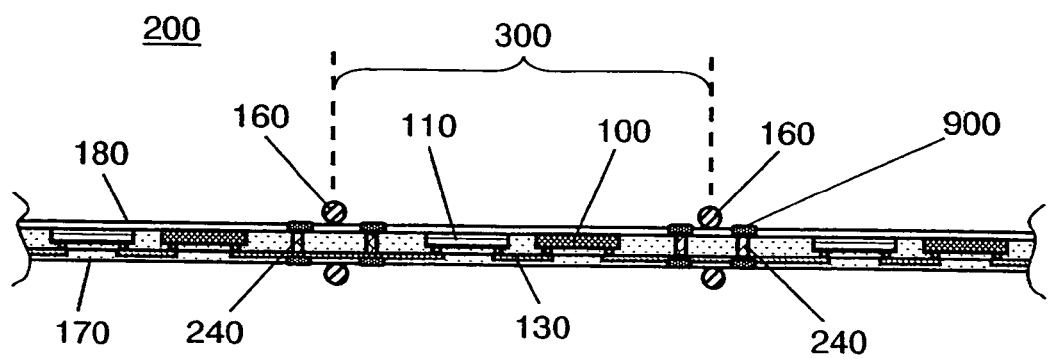
FIGS. 10A-10C are cross sectional views of main parts of the circuit module during and after main processes of the processes shown in FIG. 9.
Figure 10B:
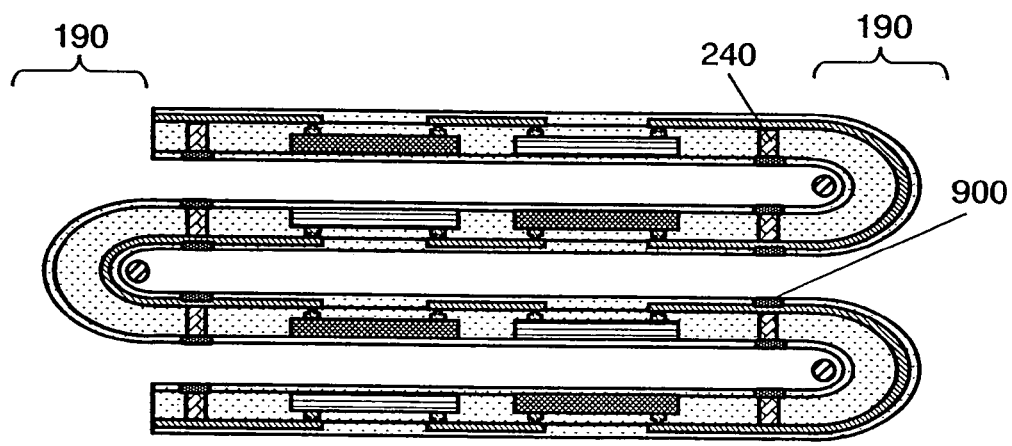
Figure 10C:
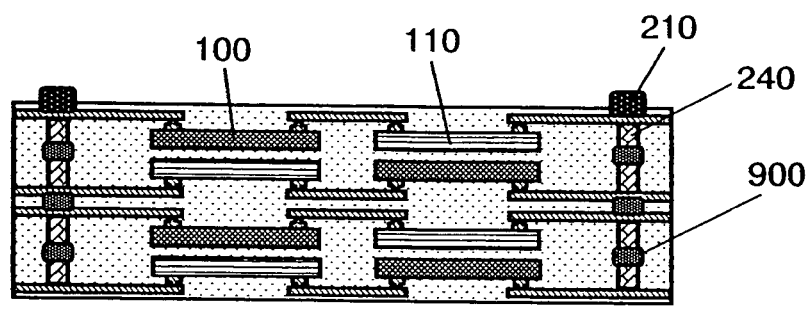
Figure 11:
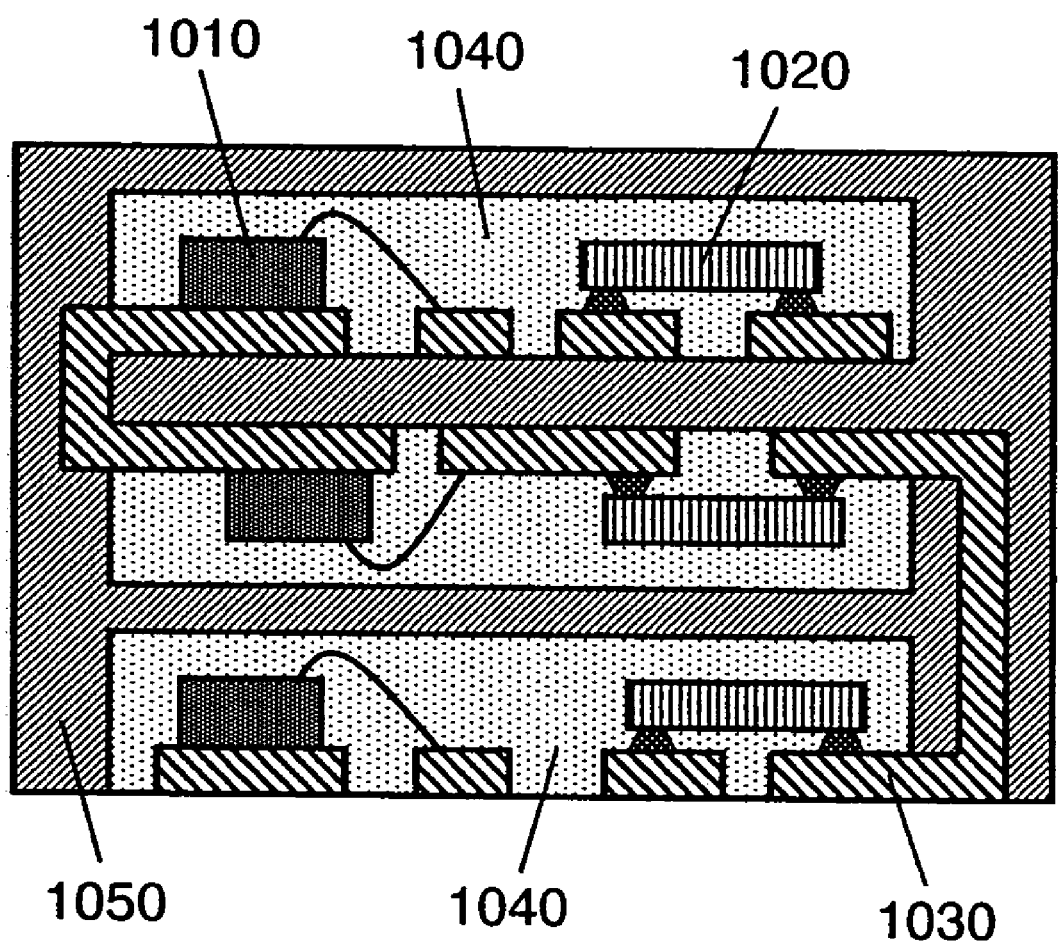
FIG. 11 is a cross sectional view of a circuit module according to a conventional example.

FIG. 9 is a flowchart depicting the manufacturing processes of the circuit module according to the present embodiment. FIGS. 10A to 10C are cross sectional views of main parts of the circuit module during and after main processes of the processes shown in FIG. 9.

First, at Step S1, semiconductor chips 100, passive components 110 and conductive members 240 are prepared. Semiconductor chips 100 are polished into a flaky shape and have bumps 140 formed on their electrodes (not illustrated) by wire bonding or the like. Passive components 110 are provided with projecting electrodes 150. Conductive members 240 are provided to connect between the layers. Semiconductor chips 100 and passive components 110 may have a thickness of about 50 μm. Bumps 140 and projecting electrodes 150 have preferably a uniform height of about 25 μm by polishing or pressing, but the height is not limited to this size. When they are cylindrical, conductive members 240 are made to have a diameter of 0.2 mm and a height similar to the thickness of component-embedded sheet 120.

At Step S2, semiconductor chips 100 provided with bumps 140, passive components 110 provided with projecting electrodes 150, and conductive members 240 are placed in predetermined positions of a sheet of, e.g. 75 μm in thickness and made from a thermoplastic resin such as polyethylene terephthalate (PETG), vinyl chloride, polycarbonate, acrylonitrile butadiene styrene or the like. At this moment, conductive members 240 are placed in the direction perpendicular to the sheet surface.

At Step S3, the sheet mounted with semiconductor chips 100, passive components 110 and conductive members 240 is sandwiched between hot press plates and pressed while applying heat. In the case where the sheet is made from PETG, the pressing conditions are as follows: a pressure of 30 kg/cm$^2$, a temperature of 120° C. and a pressing time of 1 minute. This process makes semiconductor chips 100 and passive components 110 embedded in the sheet, with at least the surfaces of bumps 140, projecting electrodes 150 and conductive members 240 exposed on a surface of the sheet. This embedding results in the formation of component-embedded sheet 120.

At Step S4, second cover sheet 180 of, e.g. 25 μm in thickness is laminated on the rear surface of component-embedded sheet 120 that is embedded with semiconductor chips 100 and passive components 110. This process can be omitted if the rear surface of the component-embedded sheet 120 that is embedded with semiconductor chips 100 and passive components 110 has a high bonding strength when thermal-bonded. This omission results in a thinner circuit module. Alternatively, second cover sheet 180 may be laminated at Step S6 described later.

At Step S5, conductive paste is screen-printed onto the front surface of component-embedded sheet 120 on which the bumps 140 and projecting electrodes 150 are exposed. The conductive paste is dried and hardened by being heated, e.g. at 110° C. for 10 minutes so as to form wiring patterns 130 which have a predetermined pattern shape and are connected with bumps 140 and projecting electrodes 150.

At Step S6, the front surface of component-embedded sheet 120 that is provided with wiring patterns 130 is laminated with first cover sheet 170 of, e.g. 25 μm in thickness. At this moment, second cover sheet 180 may be laminated as necessary.

At Step S7, first cover sheet 170 and second cover sheet 180 that are in the positions of conductive members 240 to connect between the different layers are removed with a laser or the like as necessary, and openings 900 are filled with conductive paste.

The cross sectional view of the structure when this process is complete is shown in FIG. 10A. Step. S7 can be omitted to provide blind holes.

The processes subsequent to the folding process (Step S8) shown in FIG. 10B are the same as those (corresponding to the processes subsequent to Step S7 shown in FIG. 2) in the first embodiment, and their description will be omitted.

Finally, folded parts 190 are cut with a dicing saw or the like, and connection electrodes 210 to be connected with an external circuit are formed (Step S11), thereby obtaining circuit module shown in FIGS. 8 and 10C.

Since being integrated between the layers by thermal bonding, module sheet 200 has the advantage of being unlikely to cause delamination, which may lead to electronic migration or breaking of wire and so on.

Conductive members 240 can be made from material with low resistance such as metal wire, so that the wiring resistance can be further reduced. This leads to noise reduction and improvement in high frequency characteristics of the circuit module.

It is also possible to replace the process at Step S7 by the process of embedding conductive members 240 having a length close the thickness of module sheet 200, while module sheet 200 is formed of component-embedded sheet 120, first cover sheet 170 and second cover sheet 180 stacked or integrated with each other. This can simplify the manufacturing process.

In each embodiment of the present invention, the multi-layer structure consists of four layers; however, the number of stacked layers is not limited to this, but can be determined in terms of necessary circuit scale, size, cost and the like.

According to the present invention, a thin and multilayer circuit module which is densely embedded with semiconductor chips and passive components can be manufactured in a simple manner.

Furthermore, the opposed layers of the module sheet are thermal-bonded and integrated with each other not by using an adhesive having a different composition from the material of the module sheet, but by thermal-bonding a thermoplastic resin having the same composition as the material of the module sheet. As a result, delamination due to temperature changes, stress or the like is unlikely to occur.

Thus, circuit modules used for high-performance smart and memory cards and mobile devices of various kinds can be manufactured at low cost.

What is claimed is:

1. A circuit module comprising:
a component-embedded sheet embedded with a plurality of electronic components,
the plurality of electronic components are buried in the component-embedded sheet and grouped into a plurality of circuit blocks;
at least one respective projecting electrode attached to each of the plurality of electronic components with at least surfaces of the projecting electrodes of the electronic components exposed from the sheet;
the component-embedded sheet is folded along boundaries between the circuit blocks so as to form the plurality of stacked circuit blocks connected via bended portions,
a wiring pattern disposed in at least the bended portions touches a) the at least one projecting electrode attached to one of the plurality of electronic components disposed in one of the plurality of circuit blocks, and b) the at least one projecting electrode attached to at least one other of the plurality of electronic components disposed in one other adjacent circuit block,
a cover sheet coats the wiring pattern, and
the component-embedded sheet and the cover sheet are thermal-bonded resulting in the component-embedded sheet being integrated with the cover sheet such that a visual boundary between the component-embedded sheet and the cover sheet is removed after thermal bonding.

2. The circuit module of claim 1 further comprising:
a sheet-like passive element which is electrically connected with the wiring pattern.

3. The circuit module of claim 1, wherein
the component-embedded sheet and the cover sheet are made from a thermoplastic resin.

4. The circuit module of claim 1, wherein
the wiring patterns on each of the circuit blocks of the component-embedded sheet are connected with each other via a throughhole penetrating the circuit blocks.

5. The circuit module of claim 1, wherein
the wiring patterns are electrically connected with each other via a conductive material embedded in each of the circuit blocks of the component-embedded sheet.

6. The circuit module of claim 1, wherein
the wiring pattern disposed on an outermost one of the plurality of stacked circuit blocks of the component-embedded sheet is provided with a connection electrode to be connected with an external circuit.

7. The circuit module of claim 1, wherein the component-embedded sheet is folded using a support bar along boundaries between the circuit blocks so as to form the plurality of stacked circuit blocks connected via bended portions.

* * * * *